(12) United States Patent
Sutardja

(10) Patent No.: US 6,762,708 B1
(45) Date of Patent: *Jul. 13, 2004

(54) METHOD AND APPARATUS FOR EQUALIZING THE DIGITAL PERFORMANCE OF MULTIPLE ADCS

(75) Inventor: Sehat Sutardja, Cupertino, CA (US)

(73) Assignee: Marvell International, Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 10/460,120

(22) Filed: Jun. 12, 2003

Related U.S. Application Data

(63) Continuation of application No. 09/713,199, filed on Nov. 16, 2000, now Pat. No. 6,606,048.

(51) Int. Cl.[7] .................................................. H03M 1/12
(52) U.S. Cl. ........................ 341/155; 341/120; 341/118
(58) Field of Search ................................. 341/155, 118, 341/120, 156, 158, 159, 154; 345/98

(56) References Cited

U.S. PATENT DOCUMENTS

| | | | |
|---|---|---|---|
| 4,968,988 A | 11/1990 | Miki et al. | 341/141 |
| 5,239,299 A | 8/1993 | Apple et al. | 341/118 |
| 5,706,008 A | 1/1998 | Huntley, Jr. et al. | 341/156 |
| 5,726,676 A | 3/1998 | Callahan, Jr. et al. | 345/98 |
| 5,861,829 A | 1/1999 | Sutardja | 341/122 |
| 6,091,346 A | 7/2000 | Muresan et al. | 341/56 |
| 6,229,467 B1 | 5/2001 | Eklund et al. | 341/120 |
| 6,606,048 B1 * | 8/2003 | Sutardja | 341/155 |

* cited by examiner

*Primary Examiner*—Peguy JeanPierre

(57) ABSTRACT

Method and apparatus for equalizing the digital performance of multiple ADCs includes structural and/or steps for coupling at least one global line between the ADC=s resistor ladders to allow current to flow therebetween to balance the reference voltages applied to the comparators of the ADCs. Preferably, the reference voltages are applied equally between the resistor ladders. Even more preferably, the ADC=s comparators arc located close to each other on a monolithic CMOS circuit.

58 Claims, 3 Drawing Sheets

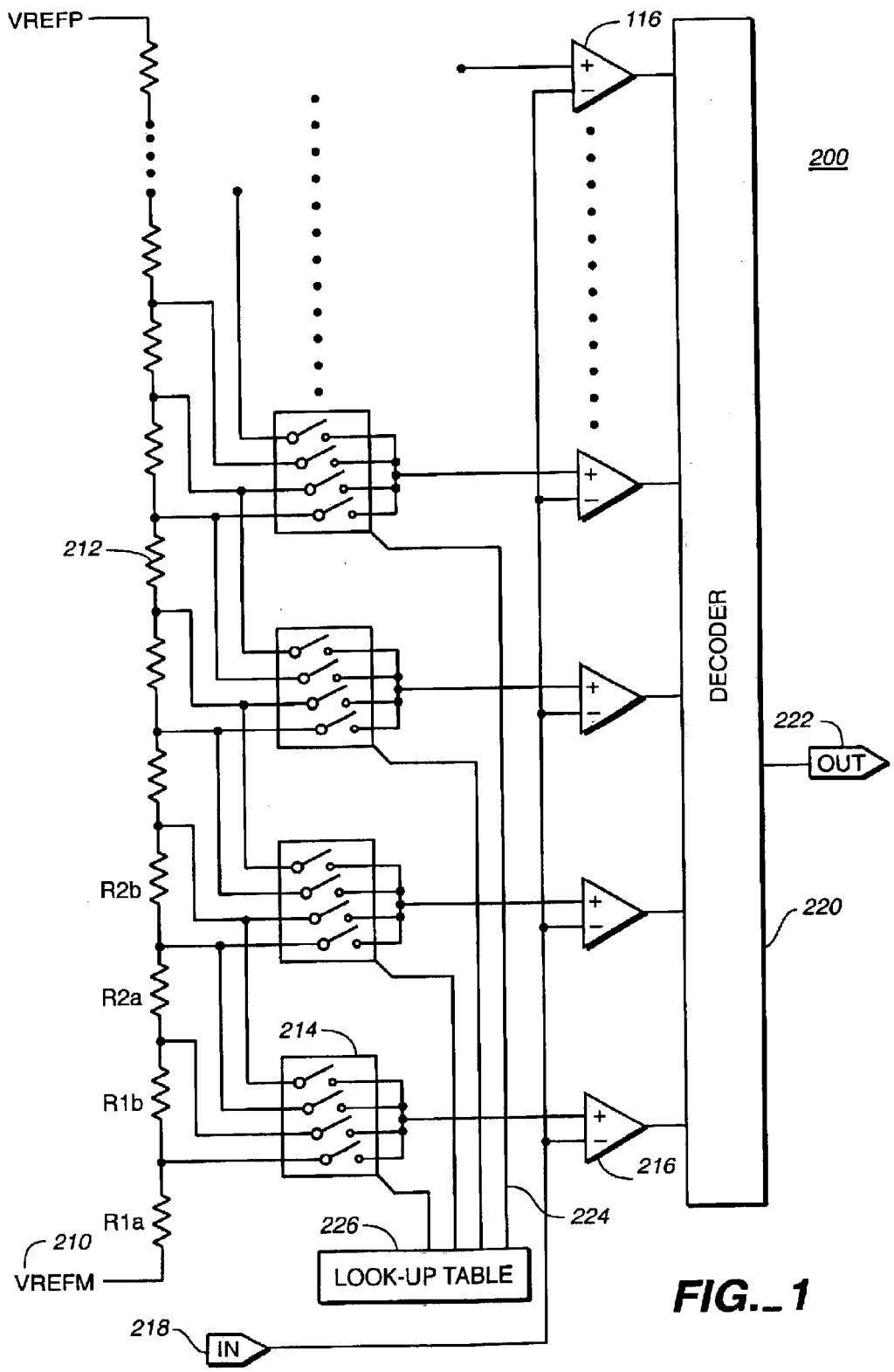
FIG._1

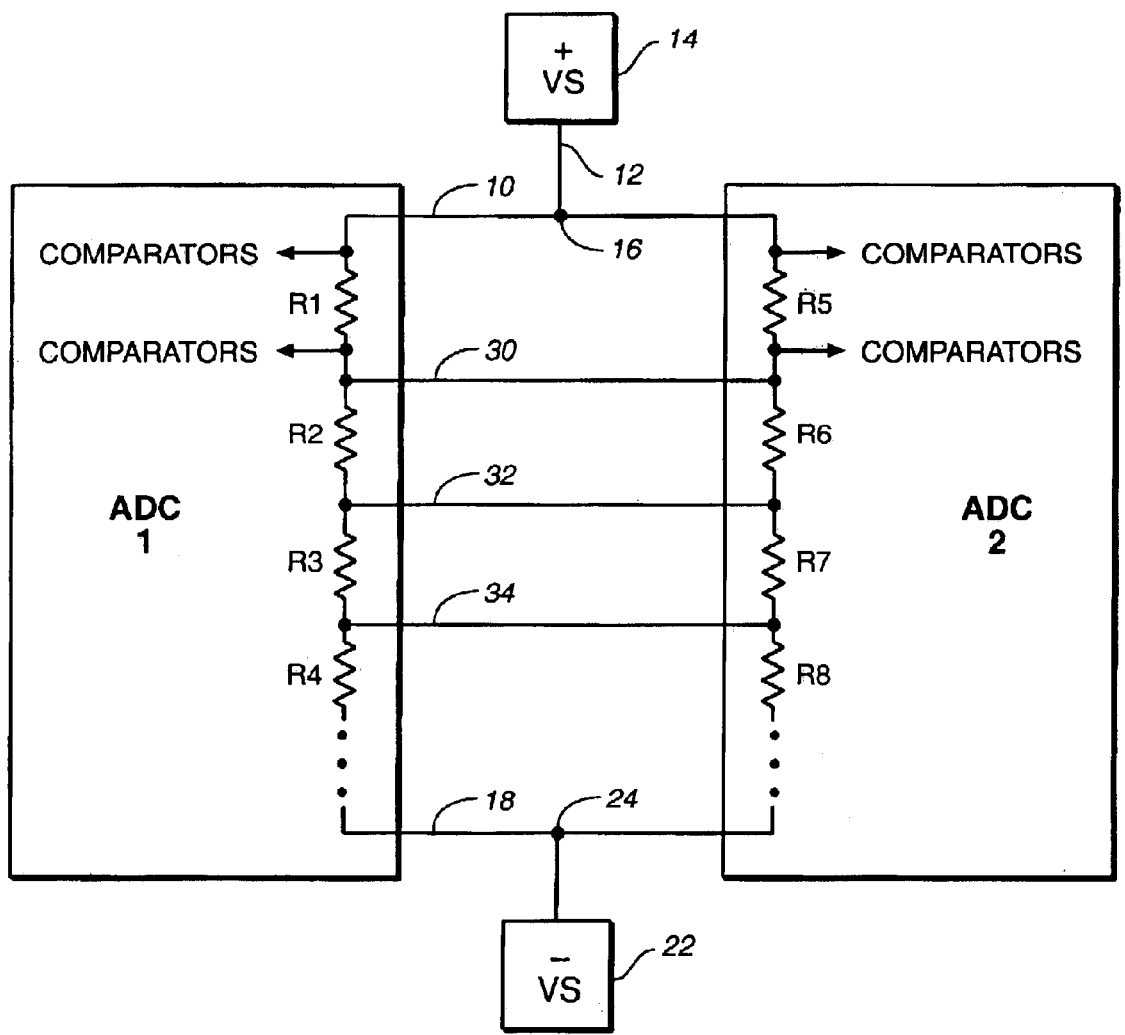
FIG._2

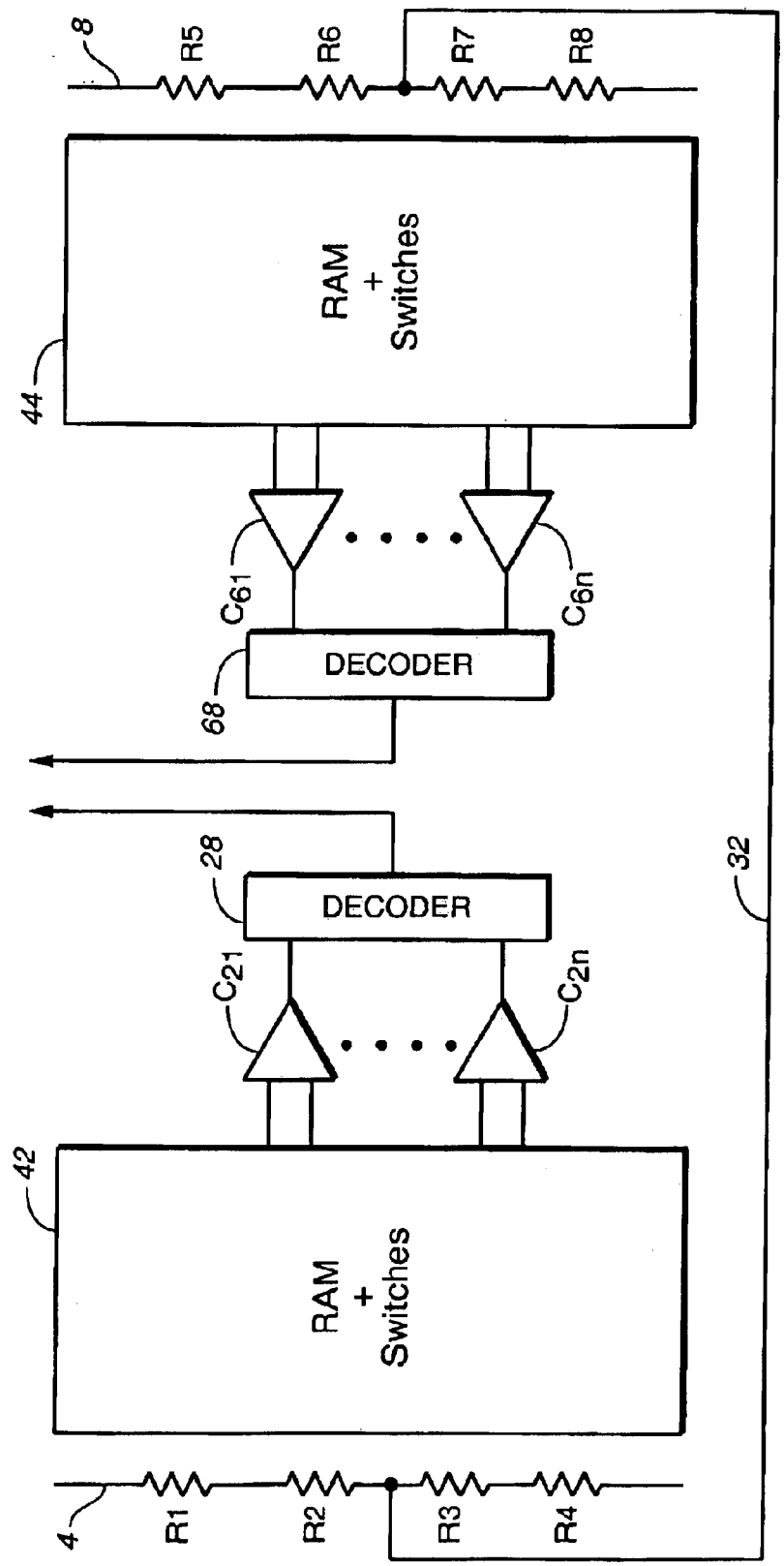
FIG._3

US 6,762,708 B1

METHOD AND APPARATUS FOR EQUALIZING THE DIGITAL PERFORMANCE OF MULTIPLE ADCS

CONTINUING DATA

This application is a continuation application of application Ser. No. 09/713,199 filed Nov. 16, 2000 now U.S. Pat. No. 6,606,048, the contents of which are incorporated herein by reference

BACKGROUND OF THE INVENTION

1. Field of the Invention

The present invention relates to method and apparatus for improving the dynamic performance of multiple analog-to-digital converters (ADCs), and in particular to balancing the application of reference voltages to the ADC's comparators by coupling together the ADC's resistor ladders with at least one global line to allow current to flow therebetween, and, preferably, by applying reference voltages equally to the ADC=s resistor ladders.

2. Related Art

To improve speed in analog-to-digital conversion, an interleaving technique may be adopted whereby a plurality of ADCs are coupled in parallel and timed sequentially in order to rapidly convert an incoming analog signal to an n-bit digital signal. The more ADCs that are coupled together, the faster the overall output. While speed is thus improved, accuracy may suffer due to the variations between the ADCs in, for example, gain, offset, timing, frequency/phase response, non-linearity, etc. These variations often result from minor manufacturing differences between the ADCs, and such differences become more pronounced as the dimensions of the ADCs decrease. U.S. Pat. No. 4,968,988 (incorporated herein by reference) addresses this problem by providing a plurality of ADC sub-converters monolithically integrated in one array and sequentially activated in a time-interleaved fashion. ADC sub-converters in proximity to each other are activated in an attempt to minimize manufacturing differences to improve the differential linearity. However, ADC-to-ADC variations still exist, leading to relatively poor dynamic performance.

U.S. Pat. No. 5,239,299 (incorporated herein by reference) discloses an equalizing method for compensating ADC-to-ADC variations, by designation one of the ADCs as a reference ADC. Individual characteristics of the remaining ADCs are compared with the reference ADC to provide differential responses thereto. These differential responses are then equalized to provide compensation for variations in gain, offset, etc. However, such comparison and equalization circuitry requires additional space and introduces yet another source of variations which introduce further inaccuracies.

Thus, what is needed is a simpler, multiple-ADC design (capable of monolithic integration) which will greatly reduce ADC-to-ADC variations and improve dynamic performance.

SUMMARY OF THE INVENTION

It is an object of the present invention to overcome the problems described above, and to provide a multiple ADC design which equalizes ADC performance by ensuring that substantially equal reference voltages are applied to the comparators of each ADC.

In a first aspect of the present invention, equalizing first and second ADCs (which have corresponding first and second resistor strings) includes structure and/or steps whereby a positive reference voltage terminal is disposed substantially halfway between the first resistor string and the second resistor string. A negative reference voltage terminal is disposed substantially halfway between the first resistor string and the second resistor string, and a global line couples together the first resistor string and the second resistor string at a point spaced from both the positive reference voltage terminal and the negative reference voltage terminal.

According to another aspect of the present invention, ADC apparatus includes a first ADC having a first decoder, a first plurality of comparators, a first switching circuit, a first RAM, and a first resistor ladder. A second ADC is provided and has a second decoder, a second plurality of comparators, a second switching circuit, a second RAM, and a second resistor ladder. Positive voltage wiring is coupled to first ends of the first and second resistor ladders, and negative voltage wiring is coupled to second ends of the first and second resistor ladders. A positive reference terminal is disposed at a midpoint of the positive voltage wiring, and a negative voltage terminal is disposed at a midpoint of the negative voltage line. A global line is coupled between the first and second resistor ladders and tends to equalize current flowing in the first and second resistor ladders.

BRIEF DESCRIPTION OF THE DRAWINGS

FIG. 1 is a block diagram of a known ADC.

FIG. 2 is a block diagram of a two-ADC configuration according to the present invention.

FIG. 3 is a block diagram of a two-ADC configuration according to a preferred embodiment of the present invention.

DETAILED DESCRIPTION OF THE PRESENTLY PREFERRED EMBODIMENTS

While the present invention will be described with respect to a dual ADC, time-interleaved monolithic CMOS circuit including switching, track/hold, and memory circuitry deployed in the read channel of a hard disk drive, the ADC configurations described herein may be used in any digital circuitry requiring high speed analog-to-digital conversion with improved equalization. Also, any number of ADCs may be provided, as required, for the particular circuit under consideration.

First, a known single ADC configuration will be described with reference to U.S. Pat. No. 5,861,829 (incorporated herein by reference) to better understand the detailed ADC circuitry. The >829 Patent employs a so-called Afull flash architecture in which the analog-to-digital conversion is done in parallel by using approximately $2^n$ voltage comparators. The >829 Patent ADC operates on an input voltage with a track/hold circuit coupled to a reference input of each of the ADC=s multiple comparators. Particular track/hold circuits are activated in sequence through a track/hold select circuit, and a look-up table and a digital-to-analog converter are coupled to supply corrected reference voltages to each track/hold circuit. Outputs of the comparators are supplied to a decoder which produces the digital output representative of the input voltage. The converter is calibrated before it is used for conversion by sensing the input offset voltages of each of the comparators and by altering the reference voltage for each comparator to produce a calibrated reference voltage for each comparator. A digital representation of the calibrated reference voltage for each comparator is stored in a look-up table for retrieval as needed to supply to a particular track/hold circuit a corresponding calibrated analog reference voltage for a particular comparator. Digital representations in the look-up table may indicate switch settings required to provide corrected reference voltages, or may indicate the required corrected reference voltage that is supplied by digital to analog converter which converts the digital representation into an analog corrected reference voltage that is held by the track/hold circuit. In this manner, each track/hold circuit is loaded with its respective calibrated reference voltage. An input signal applied to each comparator triggers such comparators upon parity between the corrected reference voltage and input voltage, and all comparator outputs are supplied to a decoder which produces a digital representation of the input signal. Occasionally, the entries in the look-up table and each track/hold circuit may be refreshed or updated in order to compensate for drift of the calibrated reference voltage.

In FIG. 1, a full flash ADC 200 includes an array of comparators 216 arranged to receive associated reference voltages selected via the switching circuits 214. The resistors in resistor ladder (or string) 212 divide the reference voltage into a plurality of thresholds with incremental variations available about each threshold. Each switching circuit 214 may have four switches to couple a different voltage threshold (that is selectable via commands sent over a switching network circuit 224) to the associated comparator reference input. Accordingly, each switch 214 can provide one of four different reference voltages to a reference input of its respective comparator 216.

The offset voltage for each comparator 216 is obtained by a self-calibration process performed before the ADC 200 begins operating. For example, upon initial factory test or upon each power up of the circuit, a zero input voltage at input 218 should yield a zero digital output indication at the output 222 of decoder 220. Specifically, each comparator 216 is activated in sequence with a known input voltage on one input and with selectable increments around a desired threshold reference value available to apply to the other input of each comparator in succession. Of course, other comparators 216 than the one being calibrated can be disabled to avoid adverse effects on decoder 220. Any deviation between known inputs applied to a comparator that produces an output therefrom maybe compensated by alternative settings of switching circuits 214 to provide an offset correcting reference voltage to the comparator. In this way, each comparator 216 provides an output to the decoder 220 for a known input voltage when compared with its corrected reference input voltage during normal operation. The settings of the switching circuits 214 that are required to so-calibrate each comparator against its individual offset errors may be stored in look-up table 226 for recall during normal operation on unknown voltages applied to input 218. Digital values describing the settings of switching circuits 214 to provide the proper offset voltages for the comparators 216 are stored in entries of a look-up table 226 which may be a segment of random access memory (RAM) or other storage device. During normal operation of the ADC 200, the look-up table 226 provides the digital values needed to select a reference voltage that compensates for the inherent offset voltage of each comparator 216. The selected reference voltage for each comparator 216 will be somewhat different from the ideal reference voltage at each threshold level per comparator 216. Of course, the greater the comparator 216 input offset voltage, the greater the difference between the ideal reference voltage and the corrected reference voltage as determined by the settings of the switching circuits 214.

FIG. 2 depicts a dual ADC configuration wherein ADC1 and ADC2 are time-interleaved, 64-comparator ADCs with resistor ladders, decoders, switching circuitry, and memory, as described above. ADC1 includes a resistor ladder 4 comprising a plurality of resistors R1, R2, R3, and R4. Of course, any arrangement of resistors and resistor values may be provided by the circuit designer for the particular application at hand. There may be any number of resistors in each string, and there may be one or more (or zero) resistors between comparator tap points on each string. In similar fashion, ADC2 includes a resistor ladder 8 comprising resistors R5, R6, R7, and R8. Preferably, the resistor values of the resistors of resistor ladder 4 are similar or equal to the resistor values of the corresponding resistors of resistor ladder 8, although the resistor layout may be varied to suit a particular application. Also, each resistor string may include other active or passive circuitry (such as capacitors, diodes, transistors, digital signal processors, etc.), as required.

Positive reference voltage is supplied to both ADCs via a positive reference voltage line 10, which is preferably coupled to the ends of resistor ladders 4 and 8, as shown. Positive voltage is provided to voltage line 10 from positive voltage source 14 over line 12. A positive reference voltage terminal 16 is disposed substantially halfway between resistor ladders 4 and 8, substantially at the midpoint of voltage line 10, to ensure, to the extent possible, an equal application of the positive reference voltage to both ADCs. Likewise, negative reference voltage (or any voltage (or ground) necessary to provide the relative voltage difference as required by the ADCs) may be supplied to the ADCs via a negative reference voltage line 18, which is coupled to the other ends of resistor ladders 4 and 8, as shown. The negative reference voltage is provided from a negative voltage source 22, through line 20, to a negative reference voltage terminal disposed substantially halfway between resistor ladders 4 and 8, substantially at the midpoint of voltage line 18. Depending on the balance of the resistor values in the resistor ladders 4 and 8, it may be possible that the reference voltages are applied at points other than the midpoints of voltage lines 10 and 18. Nevertheless, the reference voltage terminal (or terminals) should be positioned so as to provide effectively balanced voltage to the tap points in each resistor ladder. Also, it is not necessary that the reference voltages be positive and negative; one voltage source may be sufficient, and/or a ground connection may also be preferred, depending on the circuit application. Also, each reference voltage line may include other active or passive circuitry (such as capacitors, diodes, transistors, digital signal processors, etc.), as required.

To balance the application of the reference voltage(s), to the ADC comparators, one or more global lines 30, 32, and/or 34 may be coupled between the resistor ladders 4 and 8, as shown in FIG. 2. The global lines preferably comprise simple wirings, although more complex balancing structures may be adopted including other passive or active circuitry. The global lines tend to equalize the application of reference voltage(s) to the complementary (or corresponding) comparators of the ADCs by allowing over or under current flow conditions to be balanced. That is, current can freely flow to the lower voltage resistor ladder in order to (to the extent possible) keep equal reference voltage(s) flowing in the resistor ladders and to the complementary comparators. Of course, the more global lines that are provided, the greater the equalization of reference voltages to the comparators. But, the choice of the number of global lines must be balanced by the area available on the integrated circuit under consideration. As one example, for a dual, 64-bit ADC time-interleaved configuration used in the read channel of a hard disk drive, four or eight global lines may provide adequate equalization.

FIG. 3 depicts a particularly preferred embodiment wherein equal dynamic performance of the ADC comparators is further enhanced by physically locating the complementary comparators as close together as possible, to minimize manufacturing variations. In FIG. 3, comparators $C_{21}$ to $C_{2n}$ of ADC 1 are disposed as closely as possible to the comparators $C_{61}$ to $C_{6n}$ of ADC 2. Decoders 28 and 68 may be disposed between the comparators, as shown, or the decoders may be located above or below the comparator arrays. In this configuration, ADC 1's RAM and switching circuitry 42 and ADC 2's RAM and switching circuitry 44 are disposed on opposite sides of the comparator arrays, while the resistor ladders 42 and 44 are disposed outside of the RAM and switches, as shown. One or more of the global lines 32 may be disposed above or below the comparators (above or below in the plane of FIG. 3, or in the depth direction thereof). Any number of ADCs may be configured in such an arrangement, as long as the comparators are located closely together.

Thus, what has been described is a multiple ADC design in which the dynamic performance of the ADCs is enhanced by structure that permits current to flow between the ADC=s resistor ladders thus tending to equalize the performance of the ADC=s comparators. Preferably, one or more reference voltages are supplied evenly to the ADC=s comparators by locating the reference voltage(s) terminal(s) at the midpoint (s) of the reference voltage supply line(s). More preferably, a monolithic, multiple ADC design has the ADC comparators located closely together, with the RAM, resistor ladder, and switching circuitry disposed outside of the comparators.

While the present invention has been described with respect to what are presently believed to be the preferred embodiments, it is to be understood that the invention is not limited to the disclosed embodiments. To the contrary, the invention is intended to cover various modifications and equivalent arrangements included within the spirit and scope of the following claims. The scope of the following claims is to be afforded the broadest interpretation so as to encompass all such modifications and equivalent structures and functions.

What is claimed is:

1. Apparatus for equalizing first and second Analog-to-Digital converters, which have corresponding first and second resistor strings, comprising:
    a first reference voltage terminal;
    a second reference voltage terminal;
    a global line coupling together the first resistor string and the second resistor string at a point spaced from both the first reference voltage terminal and the second reference voltage terminal;
    a first reference voltage line coupling together a first portion of the first resistor string and a first portion of the second resistor string, the first reference voltage terminal being coupled to said first reference voltage line at substantially a midpoint thereof, and
    a second reference voltage line coupling together a second portion of the first resistor string and a second portion of the second resistor string, the second reference voltage terminal being coupled to said second reference voltage line at substantially a midpoint thereof.

2. Apparatus according to claim 1, further comprising a second global line coupling together the first resistor string and the second resistor string at a point spaced from said global line.

3. Apparatus according to claim 2, further comprising the first and second resistor strings, and wherein each resistor string includes a first resistor disposed between said first reference voltage terminal and said global line, a second resistor disposed between said global line and said second global line, and a third resistor coupled between said second global line and said second reference voltage terminal.

4. Apparatus according to claim 3, wherein the first, second, and third resistors of said first resistor string have substantially the same resistive values as the corresponding first, second, and third resistors of said second resistor string.

5. Apparatus according to claim 1, wherein first and second Analog-to-Digital converters include corresponding first and second pluralities of comparators, and wherein said first and second resistor strings are disposed on opposite sides of the first and second pluralities of comparators.

6. ADC apparatus comprising:
    a first ADC having a first resistor ladder;
    a second ADC having a second resistor ladder;
    a first voltage wiring coupled to first ends of said first and second resistor ladders;
    a second voltage wiring coupled to second ends of said first and second resistor ladders;
    a first reference terminal coupled to a midpoint of said first voltage wiring;
    a second voltage terminal coupled to a midpoint of said second voltage wiring; and
    a global line coupled between said first and second resistor ladders to tend to equalize current flowing in said first and second resistor ladders.

7. Apparatus according to claim 6,
    wherein said first ADC comprises a first plurality of comparators, wherein said second ADC comprises a second plurality of comparators, and
    wherein said first and second resistor ladders are disposed to an outside of the first and second pluralities of comparators.

8. Apparatus according to claim 6, further comprising a plurality of global lines coupled between the first and second resistor ladders.

9. Apparatus according to claim 6,
    wherein said first ADC comprises a first decoder, a first RAM and a first plurality of comparators,
    wherein said second ADC comprises a second decoder and a second plurality of comparators, and
    wherein the first and second pluralities of comparators are disposed substantially adjacent.

10. Apparatus according to claim 9, wherein said first switching circuit and said first RAM are disposed between said first resistor ladder and said first plurality of comparators.

11. Apparatus according to claim 6, further comprising circuitry for applying a first reference voltage to said first reference voltage terminal, and for applying second reference voltage to said second reference voltage terminal.

12. Apparatus according to claim 6, wherein said ADC apparatus is disposed on a single integrated circuit.

13. A read channel having an apparatus for equalizing first and second Analog-to-Digital converters, which have corresponding first and second resistor strings, comprising:
    a first reference voltage terminal;
    a second reference voltage terminal;
    a first reference voltage line coupling together a first portion of the first resistor string and a first portion of the second resistor string, the first reference voltage terminal being coupled to said first reference voltage line at substantially a midpoint thereof: and a second reference voltage line coupling together a second portion of the first resistor string and a second portion of the second resistor string, the second reference voltage terminal being coupled to said second reference voltage line at substantially a midpoint thereof; and a global line in the read channel and coupling together the first resistor string and the second resistor string at a point spaced from both the first reference voltage terminal and the second reference voltage terminal.

14. Apparatus according to claim 13, further comprising a second global line disposed in the read channel and coupling together the first resistor string and the second resistor string at a point spaced from said global line.

15. Apparatus according to claim 14, further comprising the first and second resistor strings disposed in the read channel, and wherein each resistor string includes a first resistor disposed between said first reference voltage terminal and said global line, a second resistor disposed between said global line and said second global line, and a third resistor coupled between said second global line and said second reference voltage terminal.

16. Apparatus according to claim 15, wherein the first, second, and third resistors of said first resistor string have substantially the same resistive values as the corresponding first, second, and third resistors of said second resistor string.

17. Apparatus according to claim 13, wherein first and second Analog-to-Digital converters include corresponding first and second pluralities of comparators, and wherein said first and second resistor strings are disposed in the read channel on opposite sides of the first and second pluralities of comparator.

18. Apparatus for equalizing first and second Analog-to-Digital converters, which have corresponding first and second resistor strings, comprising:
  means for providing a first reference voltage;
  means for providing a second reference voltage;
  means for coupling together the first resistor string and the second resistor string at a point spaced from both the means for providing the first reference voltage and the means for providing the second reference voltage, to cause current to flow between said resistor strings;
  means for coupling together a first portion of the first resistor string and a first portion of the second resistor string, the means for providing the first reference voltage being coupled said means for coupling together the first portion of the first resistor string and the first portion of the second resistor string at substantially a midpoint thereof; and
  means for coupling together a second portion of the first resistor string and a second portion of the second resistor string, the means for providing the second reference voltage being coupled to said means for coupling together the second portion of the first resistor string and the second portion of the second resistor string at substantially a midpoint thereof.

19. Apparatus according to claim 18, further comprising a second means for coupling together the first resistor string and the second resistor string at a point spaced from said means for coupling together the first resistor string and the second resistor string.

20. Apparatus according to claim 19, further comprising the first and second resistor strings, and wherein each resistor string includes first and second different resistor means.

21. Apparatus according to claim 18, wherein first and second Analog-to-Digital converters include corresponding first and second pluralities of comparator means, and wherein said first and second resistor strings are disposed on opposite sides of the first and second pluralities of comparator means.

22. Apparatus for equalizing two time-interleaved ADCs, which have corresponding first and second resistor strings, comprising:
  first coupling means for coupling the first and second resistor strings;
  first applying means for applying a first reference voltage to a point substantially at a midpoint of said first coupling means; and
  global means for coupling together the first and second resistor strings at a location spaced apart from said first applying;
  second coupling means for coupling together the first and second resistor strings at a location spaced apart from both said first coupling means and said global means; and
  second applying means for applying a second reference voltage terminal to a point substantially a midpoint of said second coupling means.

23. Apparatus according to claim 22, further comprising a plurality of means for coupling together the first and second resistor strings, and wherein all said means for coupling together the first and second resistor strings are coupled to tap points on said first and second resistor strings, all of the tap points on any resistor string being separated from other tap points on that resistor string by at least one resistor.

24. Apparatus according to claim 22, further comprising:
  first and second memory means respectively coupled to said the two time-interleaved ADCs; and
  first and second switching means respectively coupled to the two time-interleaved ADCs.

25. Apparatus according to claim 22, disposed on a single CMOS integrated circuit.

26. A method for equalizing first and second Analog-to-Digital converters, which have corresponding first and second resistor strings, comprising the steps of:
  generating a first reference voltage;
  generating a second reference voltage;
  disposing a global line to couple together the first resistor string and the second resistor string at a point spaced from both the first reference voltage terminal and the second reference voltage terminal;
  disposing a first reference voltage line to couple together a first portion of the first resistor string and a first portion of the second resistor string, the first reference voltage being applied to substantially a midpoint of said first reference voltage line; and
  disposing a second reference voltage line to couple together a second portion of the first resistor string and a second portion of the second resistor string, the second reference voltage being applied substantially at a midpoint of said second reference voltage line.

27. A method according to claim 26, further comprising the step of disposing a second global line to couple together the first resistor string and the second resistor string at a point spaced from said global line.

28. A method according to claim 26, further comprising the step of disposing the first and second resistor strings such that each resistor string includes a first resistor disposed between said first reference voltage terminal and said global line, a second resistor disposed between said global line and said second global line, and a third resistor coupled between said second global line and said second reference voltage terminal.

29. A method according to claim 28, wherein the first, second, and third resistors of said first resistor string have substantially the same resistive values as the corresponding first, second, and third resistors of said second resistor string.

30. A method according to claim 26, wherein first and second Analog-to-Digital converters include corresponding first and second pluralities of comparators, and wherein said first and second resistor strings are disposed on opposite sides of the first and second pluralities of comparators.

31. A process for operating ADC apparatus comprising the steps of:
    providing a first ADC having a first resistor ladder;
    providing a second ADC having a second resistor ladder;
    coupling a first voltage wiring to first ends of said first and second resistor ladders;
    coupling a second voltage wiring to second ends of said first and second resistor ladders;
    coupling a first voltage terminal to substantially a midpoint of said first voltage wiring;
    coupling a second voltage terminal to substantially a midpoint of said second voltage wiring; and
    coupling a global line between said first and second resistor ladders to tend to equalize current flowing in said first and second resistor ladders.

32. A method according to claim 31,
    wherein said first ADC comprises a first decoder, a first plurality of comparators, a first switching circuit, and a first RAM, and
    wherein said second ADC comprises a second decoder, a second plurality of comparators, a second switching circuit, and a second RAM, and
    wherein said first and second resistor ladders are disposed to an outside of the first and second pluralities of comparators.

33. A method according to claim 31, further comprising the step of coupling a plurality of global lines between the first and second resistor ladders.

34. A method according to claim 31,
    wherein said first ADC comprises a first decoder, a first plurality of comparators, a first switching circuit, and a first RAM, and
    wherein said second ADC comprises a second decoder, a second plurality of comparators, a second switching circuit, and a second RAM, and
    further comprising the step of disposing the first and second pluralities of comparators substantially adjacent.

35. A method according to claim 34, further comprising the step of disposing said first switching circuitry and said first RAM between said first resistor ladder and said first plurality of comparators.

36. A method according to claim 31, further comprising the steps of:
    applying first reference voltage to said first reference voltage terminal, and
    applying second reference voltage to said second reference voltage terminal.

37. A method according to claim 31, further comprising the step of disposing said ADC apparatus on a single integrated circuit.

38. A process of equalizing two time-interleaved ADCs, which have corresponding first and second resistor strings, comprising the steps of:
    coupling a first reference voltage line between the first and second resistor strings;
    disposing a first reference voltage terminal at substantially a midpoint of said reference voltage line; and
    coupling a global line between the first and second resistor strings at a location spaced apart from said reference voltage line;
    supplying a first voltage to the first reference voltage terminal;
    coupling a second reference voltage line between -the first and second resistor strings at a location spaced apart from both said reference voltage line and said global line; and
    disposing a second reference voltage terminal at substantially a midpoint of said second reference voltage line.

39. A method according to claim 38, further comprising the step of coupling a plurality of global lines between the resistor strings, and further comprising the step of coupling all said global lines to tap points on said first and second resistor strings, all of the tap points on any resistor string being separated from other tap points on that resistor string by at least one resistor.

40. A method according to claim 38, further comprising the steps of:
    coupling the first and second memories respectively to the two time-interleaved ADCs; and
    coupling the first and second switching circuits respectively to the two time-interleaved ADCs.

41. A method according to claim 40, further comprising the step of disposing the ADCs on a single CMOS integrated circuit.

42. A method equalizing first and second Analog-to-Digital converters disposed in the read channel of a hard disk drive, the ADCs having corresponding first and second resistor strings, comprising the steps of:
    generating a first reference voltage;
    generating a second reference voltage; and
    coupling a global line in the read channel between the first resistor string and the second resistor string at a point spaced from both the first reference voltage terminal and the second reference voltage terminal;
    disposing a first reference voltage line in the read channel and coupling it to a first portion of the first resistor string and a first portion of the second resistor string, the first reference voltage being applied substantially at a midpoint of said first reference voltage line; and
    disposing a second reference voltage line in the read channel and coupling it to a second portion of the first resistor string and a second portion of the second resistor string, the second reference voltage being applied substantially at a midpoint of said second reference voltage line.

43. A method according to claim 42, further comprising the step of disposing a second global line in the read channel and coupling it to the first resistor string and the second resistor string at a point spaced from said global line.

44. A method according to claim 43, further comprising the step of disposing first and second resistor strings in the read channel, and wherein each resistor string includes a first resistor disposed between said first reference voltage terminal and said global line, a second resistor disposed between said global line and said second global line, and a third resistor coupled between said second global line and said second reference voltage terminal.

45. A method according to claim 44, wherein the first, second, and third resistors of said first resistor string have substantially the same resistive values as the corresponding first, second, and third resistors of said second resistor string.

46. A method according to claim 42, wherein first and second Analog-to-Digital converters include corresponding first and second pluralities of comparators, and wherein said first and second resistor strings are disposed in the read channel on opposite sides of the first and second pluralities of comparators.

47. A process for equalizing first and second Analog-to-Digital converters, which have corresponding first and second resistor strings, comprising the steps of:
   providing a first reference voltage;
   providing-a second reference voltage;
   coupling together the first resistor string and the second resistor string at a point spaced from where both the first reference voltage and the second reference voltage are provided, to cause current to flow between said resistor strings;
   coupling together a first portion of the first resistor string and a first portion of the second resistor string, the first reference voltage being applied substantially at a midpoint of where the first portion of the first resistor string and the first portion of the second resistor string are coupled together; and
   coupling together a second portion of the first resistor string and a second portion of the second resistor string, the second reference voltage being applied substantially at a midpoint of where the second portion of the first resistor string and the second portion of the second resistor string are coupled together.

48. A method according to claim 47, further comprising the step of coupling together the first resistor string and the second resistor string at a second point spaced from where the first resistor string and the second resistor string are coupled.

49. A method according to claim 48, further comprising the step of providing the first and second resistor strings, and wherein each resistor string includes first and second different resistor means.

50. A method according to claim 47, wherein first and second Analog-to-Digital converters include corresponding first and second pluralities of comparator means, and wherein said first and second resistor strings are disposed on opposite sides of the first and second pluralities of comparator means.

51. A method for equalizing two time-interleaved ADCs, which have corresponding first and second resistor strings, comprising the steps of:
   coupling one end of the first resistor string to one end of the second resistor string with a conductor;
   applying a first reference voltage is applied to a first voltage terminal substantially at a midpoint of a conductor coupling the first and second resistor strings; and
   coupling together the first and second resistor strings at a location spaced apart from where the reference voltage is applied to the first and second resistor strings;
   coupling the other end of the first resistor string to the other end of the second resistor string with another conductor;
   applying a second reference voltage at substantially a midpoint of said other conductor.

52. A method according to claim 51, further comprising the step of coupling together the first and second resistor strings at a plurality of tap points on said first and second resistor strings, all of the tap points on any resistor string being separated from other tap points on that resistor string by at least one resistor.

53. A method according to claim 51, further comprising the steps of:
   providing first and second memories respectively coupled to the two time-interleaved ADCs; and
   providing first and second switching circuits respectively coupled to the two time-interleaved ADCs.

54. A method according to claim 51, further comprising the step of disposing the ADCs on a single CMOS integrated circuit.

55. Circuitry for equalizing two time-interleaved ADCs, which have corresponding first and second resistor strings, comprising:
   a first reference voltage line coupling together the first and second resistor strings;
   a first reference voltage terminal coupled to said first reference voltage line at substantially a midpoint thereof; and
   a global line coupling together the first and second resistor strings at a location spaced apart from said reference voltage line;
   a second reference voltage line coupling together the first and second resistor strings at a location spaced apart from both said first reference voltage line and said global line; and
   a second reference voltage terminal coupled to said second reference voltage line at substantially a midpoint thereof.

56. Circuitry according to claim 55, further comprising a plurality of global lines, and wherein all said global lines are coupled to tap points on said first and second resistor strings, all of the tap points on any resistor string being separated from other tap points on that resistor string by at least one resistor.

57. Circuitry according to claim 55, further comprising:
   first and second memories respectively coupled to said two time-interleaved ADCs; and
   first and second switching circuits respectively coupled to said two time-interleaved ADCs.

58. Circuitry according to claim 57 disposed on a single CMOS integrated circuit.

* * * * *